(12) United States Patent
Tsukihashi et al.

(10) Patent No.: US 11,183,232 B2
(45) Date of Patent: Nov. 23, 2021

(54) OUTPUT BUFFER CIRCUIT WITH METAL OPTION

(71) Applicant: MICRON TECHNOLOGY, INC., Boise, ID (US)

(72) Inventors: Toshiaki Tsukihashi, Tama (JP); Kenichi Watanabe, Hachioji (JP); Kazuyuki Morishige, Sagamihara (JP); Moeha Shibuya, Sagamihara (JP); Kumiko Ishii, Machida (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/800,899

(22) Filed: Feb. 25, 2020

(65) Prior Publication Data

US 2021/0264967 A1   Aug. 26, 2021

(51) Int. Cl.
| | | |
|---|---|---|
| *G06F 1/16* | (2006.01) | |
| *G11C 11/4093* | (2006.01) | |
| *H01L 27/108* | (2006.01) | |

(52) U.S. Cl.
CPC .............. *G11C 11/4093* (2013.01); *H01L 27/10897* (2013.01)

(58) Field of Classification Search
CPC .................................................. H01L 27/0207
USPC .................................................. 365/189.011
See application file for complete search history.

(56) References Cited

U.S. PATENT DOCUMENTS

| | | | |
|---|---|---|---|
| 2016/0020165 A1* | 1/2016 | Kamgaing | H01L 23/66 |
| | | | 361/679.55 |
| 2017/0186691 A1* | 6/2017 | Yang | G06F 30/373 |
| 2017/0256529 A1* | 9/2017 | Tanuma | G06F 30/392 |

* cited by examiner

*Primary Examiner* — Min Huang
(74) *Attorney, Agent, or Firm* — Dorsey & Whitney LLP (57) ABSTRACT

Disclosed herein is an apparatus that includes: first and second wiring patterns extending in a first direction, first and second transistors arranged adjacent to each other, and third to sixth wiring patterns extending in a second direction. The third wiring pattern is connected between the first wiring pattern and one of source/drain regions of the first transistor, the fourth wiring pattern is connected between the second wiring pattern and other of source/drain regions of the first transistor, the fifth wiring pattern is connected to one of source/drain regions of the second transistor, the fifth wiring pattern overlapping with the first wiring pattern, the sixth wiring pattern is connected to other of source/drain regions of the second transistor, the sixth wiring pattern overlapping with the second wiring pattern. The third and fourth wiring patterns are greater in width in the first direction than the fifth and sixth wiring patterns.

21 Claims, 9 Drawing Sheets

OUTPUT BUFFER CIRCUIT WITH METAL OPTION

BACKGROUND

In a semiconductor device such as a DRAM, a large current flows through a transistor that configures an output buffer. Therefore, when a semiconductor device is used for a long time, it may cause a change of the shape of a wiring pattern connected to the output buffer due to a migration phenomenon. Particularly, when the cross-sectional area of the wiring pattern becomes small due to miniaturization, the density of a current flowing through the wiring pattern becomes high, so that there is a risk of disconnection caused by the migration phenomenon.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed, herein are not necessary mutually exclusive, as some disclosed embodiments can be combined with one or more other disclosed embodiments to form new embodiments.

Figure 1:
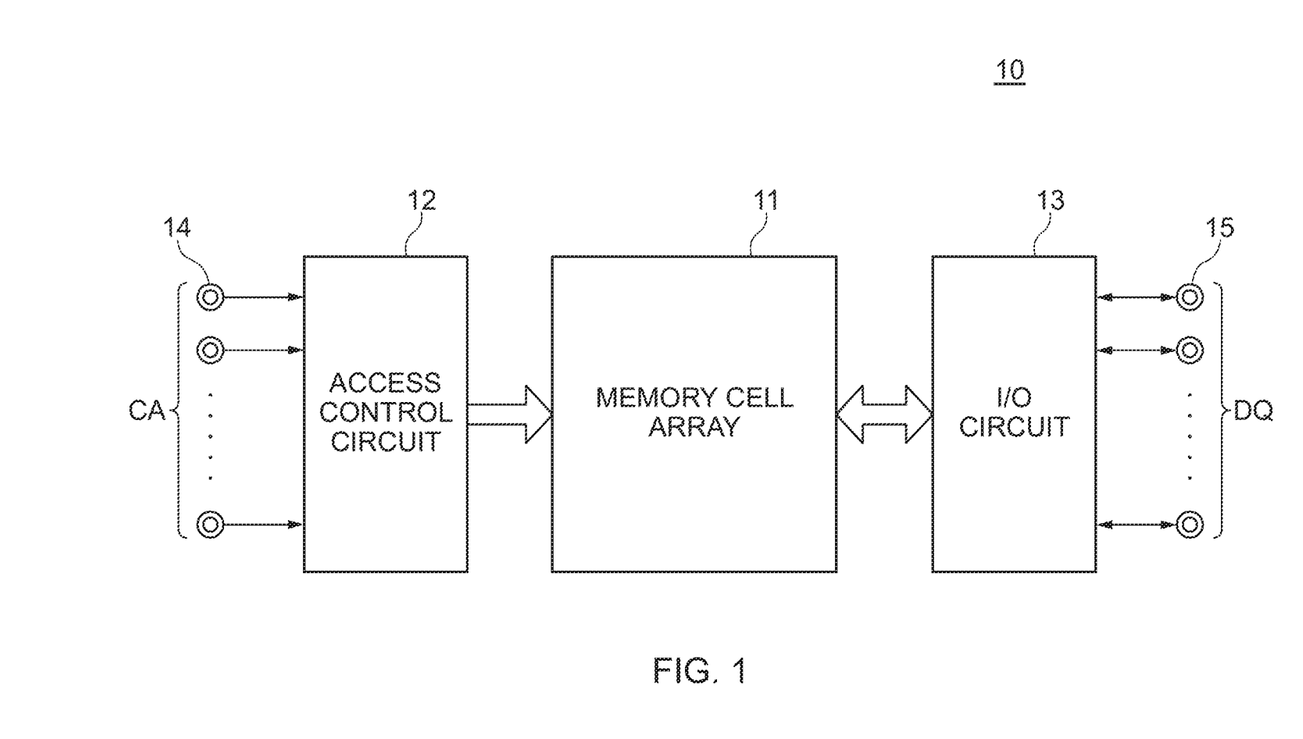
FIG. 1 is a block diagram showing a configuration of a semiconductor device according to the present disclosure.

A semiconductor device 10 shown in FIG. 1 is a DRAM, for example, and includes a memory cell array 11, an access control circuit 12 that makes access to the memory cell array 11, and an I/O circuit 13 that inputs and outputs data to and from the memory cell array 11. The access control circuit 12 makes access to the memory cell array 11 on the basis of a command address signal CA input from an external controller via command address terminals 14. In a read operation, data DQ read out from the memory cell array 11 is output to external data I/O terminals 15 via the I/O circuit 13. In a write operation, data DQ input from an external controller to the external data I/O terminals 15 is supplied to the memory cell array 11 via the I/O circuit 13.

Figure 2:
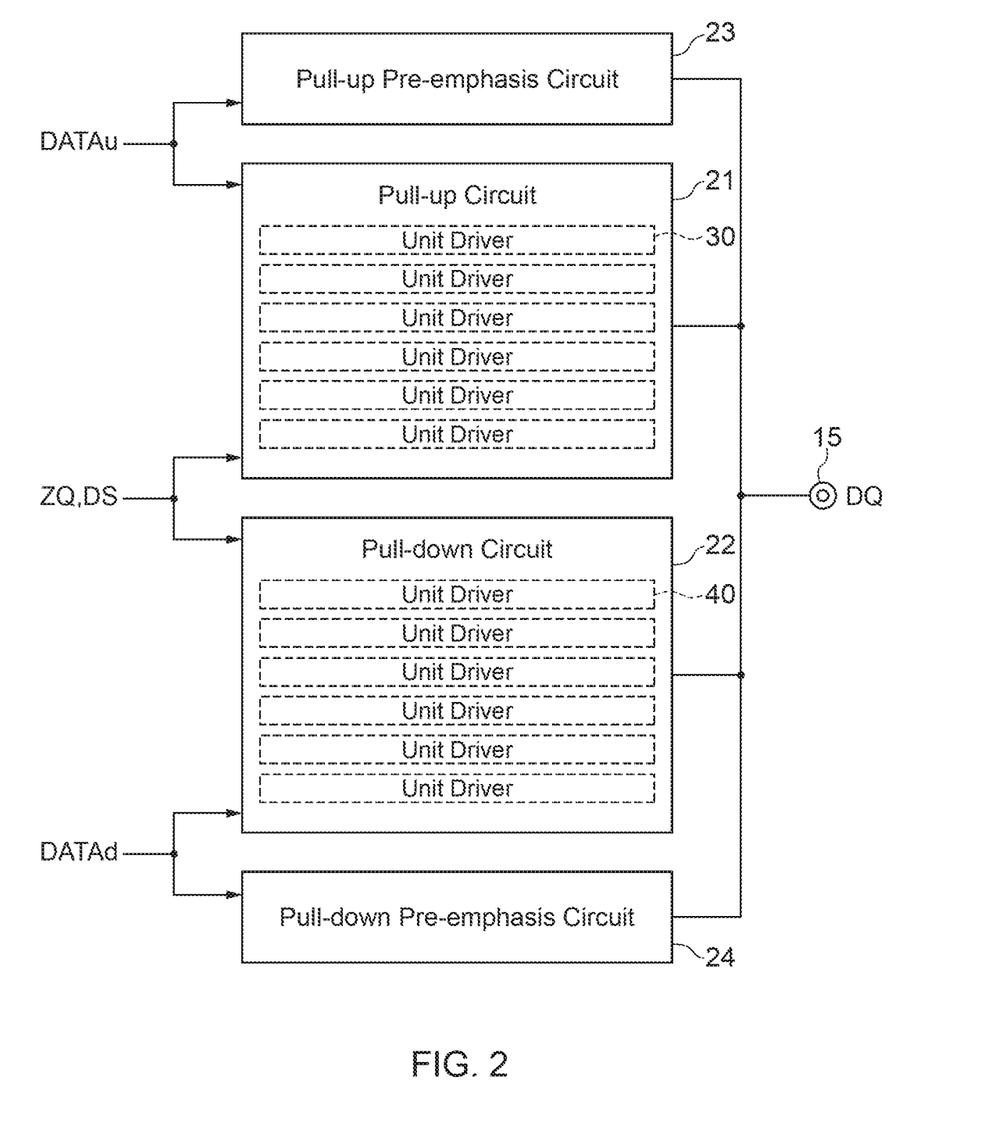
FIG. 2 is a block diagram showing a circuit of a data output system included in an I/O circuit.

FIG. 2 shows circuit blocks as a circuit of a data output system included in the I/O circuit 13, which correspond to one external data I/O terminal 15. As shown in FIG. 2, the I/O circuit 13 includes a pull-up circuit 21, a pull-down circuit 22, and pre-emphasis circuits 23 and 24. The pull-up circuit 21 is activated in a pull-up operation, that is, while high-level read data DQ is output from the external data I/O terminal 15. The pull-down circuit 22 is activated in a pull-down operation, that is, while low-level read data DQ is output from the external data I/O terminal 15. Each of the pre-emphasis circuits 23 and 24 temporarily lowers its output resistance only during a period of data transition, so as to compensate a skin resistance loss and a dielectric loss generated in a high-frequency operation. Therefore, also in the high-frequency operation, it is possible to allow data transition to occur with an appropriate slew rate and to drive the external data I/O terminal 15 with a set resistance in a steady state.

Pull-up data DATAu is supplied to the pull-up circuit 21 and the pre-emphasis circuit 23. Pull-down data DATAd is supplied to the pull-down circuit 22 and the pre-emphasis circuit 24. A calibration code signal ZQ and a driver-strength selection signal DS are supplied to the pull-up circuit 21 and the pull-down circuit 22. The pull-up circuit 21 has a configuration in which a plurality of unit drivers 30 are connected in parallel. The unit drivers 30 have the same circuit configuration as each other, and one or two or more unit drivers 30 is/are selected on the basis of the driver-strength selection signal DS. The pull-down circuit 22 has a configuration in which a plurality of unit drivers 40 are connected in parallel. The unit drivers 40 have the same circuit configuration as each other, and one or two or more unit drivers 40 is/are selected on the basis of the driver-strength selection signal DS.

Figure 3:
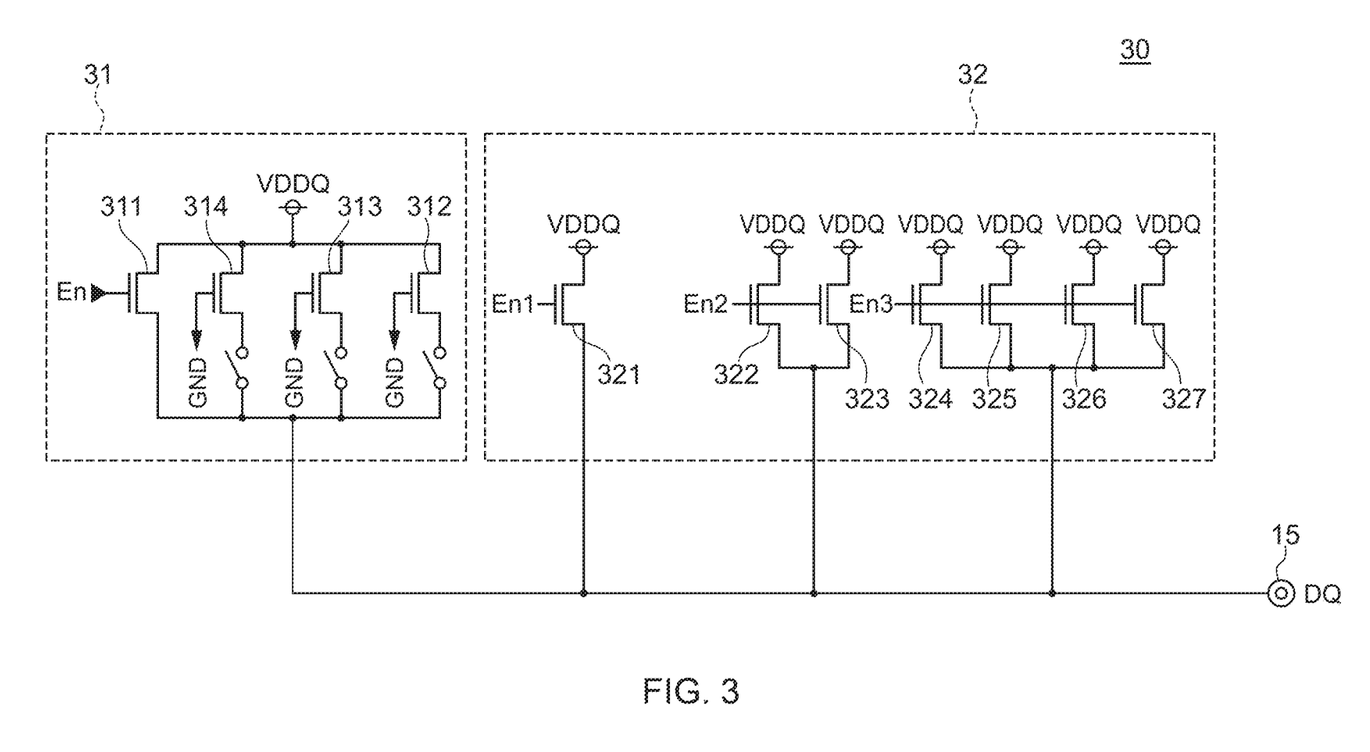
FIG. 3 is a circuit diagram of a unit driver.

As shown in FIG. 3, each unit driver 30 includes a main driver 31 and a sub-driver 32. The main driver 31 includes four N-channel MOS transistors 311 to 314 connected in parallel. Sources of the transistors 311 to 314 are connected to the external data I/O terminal 15, and a power-supply potential VDDQ is supplied to drains of the transistors 311 to 314. An enable signal En or a ground potential GND is supplied to gate electrodes of the transistors 311 to 314. In the example shown in FIG. 3, the enable signal En is supplied to the gate electrode of the transistor 311 and the ground potential GND is supplied to the gate electrodes of the other transistors 312 to 314. It is determined, by a metal option in manufacturing, whether to supply the enable signal En to the gate electrodes of the transistors 311 to 314. As for the transistors 312 to 314 to which the ground potential GND is supplied to the gate electrodes, sources thereof may be disconnected from the external data I/O terminal 15 by the metal option. In this case, it is not always necessary to supply the ground potential GND to the gate electrodes.

The enable signal En is always supplied to the gate electrode of the transistor 311, which is among the transistors 311 to 314 that configure the main driver 31. As in the example shown in FIG. 3, when the ground potential GND is supplied to the gate electrodes of the other transistors 312 to 314, the transistor that is activated in the main driver 31 is one. Therefore, the slew rate of the unit driver 30 becomes minimum. In a case where it is necessary to set the slew rate to be higher, wirings are switched by the metal option in a manufacturing stage in such a manner that the enable signal En is supplied to the gate electrodes of the transistors 311 and 312 and the ground potential GND is supplied to the gate electrodes of the other transistors 313 and 314, so that the number of transistors activated in the main driver 31 becomes two. Further, by designing wirings in such a manner that the enable signal En is supplied to the gate electrodes of the transistors 311 to 313 and the ground potential GND is supplied to the gate electrode of the other transistor 314, the number of transistors activated in the main driver 31 becomes three and the slew rate becomes even higher. By designing the wirings in such a manner that the enable signal En is supplied to the gate electrodes of all the transistors 311 to 314, the number of transistors activated in the main driver 31 becomes four and the slew rate becomes maximum. The sizes of the transistors 311 to 314 may be the same as one another.

The sub-driver 32 includes seven transistors 321 to 327. Sources of the transistors 321 to 327 are connected to the external data I/O terminal 15, and the power-supply potential VDDQ is supplied to drains of the transistors 321 to 327. An enable signal En1 is supplied to a gate electrode of the transistor 321, an enable signal En2 is commonly supplied to gate electrodes of the transistors 322 and 323, and an enable signal En3 is commonly supplied to gate electrodes of the transistors 324 to 327. The sizes of the transistors 321 to 327 may be the same as one another. Accordingly, it is possible to adjust the impedance of the unit driver 30 to eight levels by using the sub-driver 32.

Figure 4:
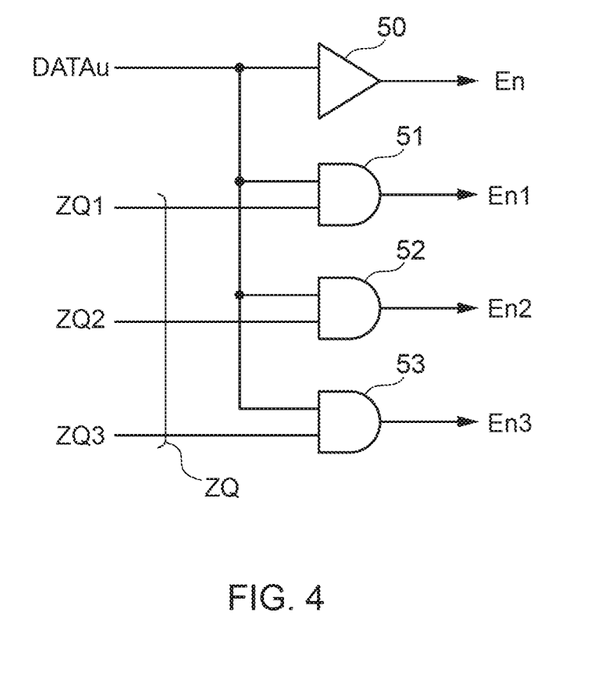
FIG. 4 is a circuit diagram of a circuit that generates enable signals.

It is also possible that the enable signals En and En1 to En3 are generated on the basis of the pull-up data DATAu and the calibration code signal ZQ. In the example shown in FIG. 4, the enable signal En is generated by buffering the pull-up data DATAu by using a buffer circuit 50. Further, the enable signals En1 to En3 are generated by logic synthesis of bit signals ZQ1 to ZQ3 that configure the calibration code signal ZQ and the pull-up data DATAu by AND gate circuits 51 to 53, respectively.

Figure 5:
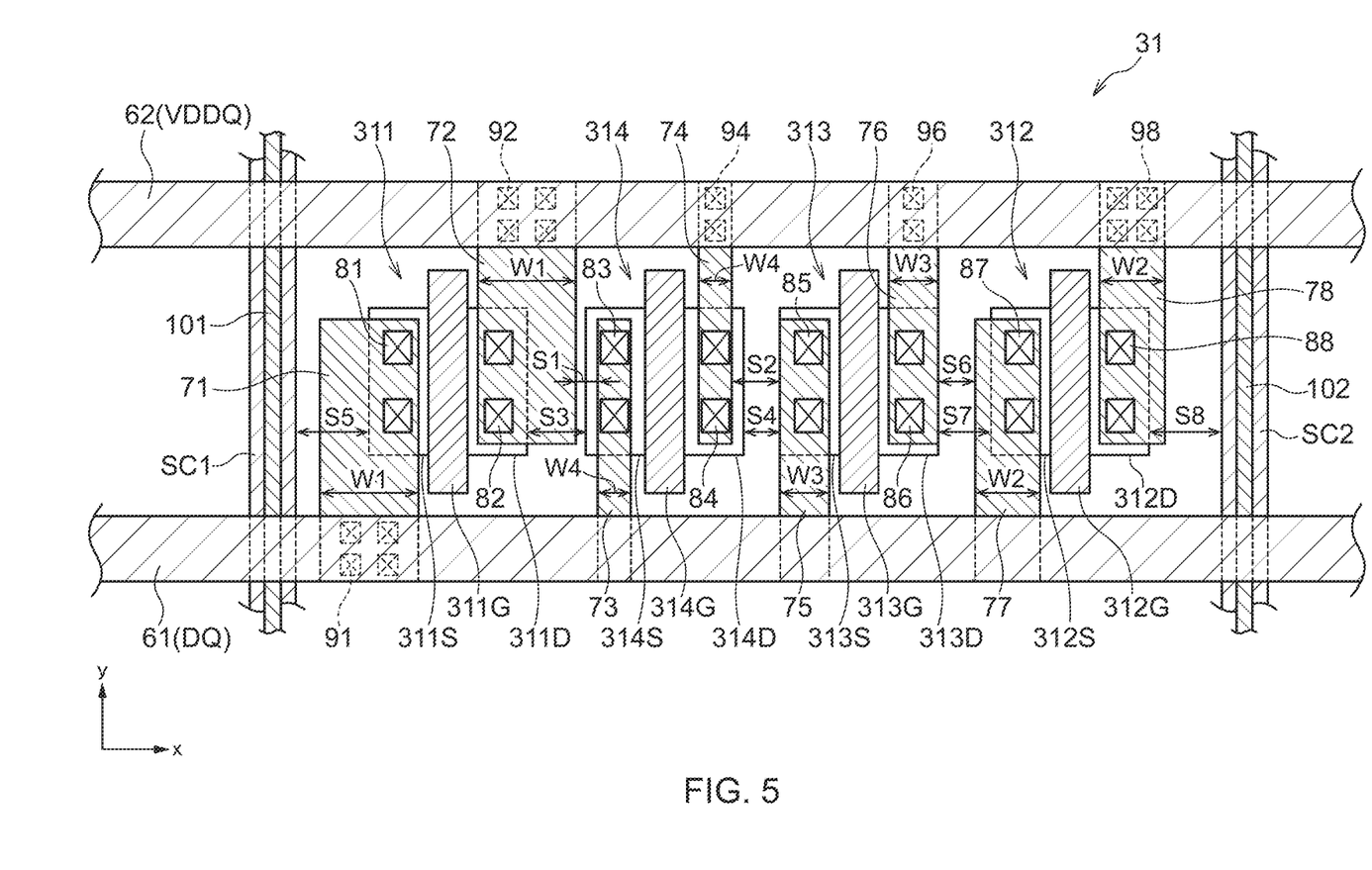
FIG. 5 is a schematic plan view showing a layout of a main driver.

FIG. 5 is a schematic plan view illustrating a layout of the main driver 31. The transistors 311 to 314 that configure the main driver 31 are arranged between wiring patterns 61 and 62 that extend in the X-direction in a plan view. The wiring pattern 61 is connected to the external data I/O terminal 15, and read data DQ appears thereon. The power-supply potential VDDQ is supplied to the wiring pattern 62. As shown in FIG. 5, the transistors 311, 314, 313, and 312 are arranged in the X-direction in this order. On the left side of the leftmost transistor 311 in FIG. 5, a diffusion region SC1 for supplying a fixed potential to a semiconductor substrate is arranged. On the right side of the rightmost transistor 312 in FIG. 5, a diffusion region SC2 for supplying a fixed potential to the semiconductor substrate is arranged.

The transistor 311 is constituted by a source region 311S a drain region 311D, and a gate electrode 311G The source region 311S is connected to a wiring pattern 71 via a contact electrode 81, and the drain region 311D is connected to a wiring pattern 72 via a contact electrode 82. The transistor 314 is constituted by a source region 314S, a drain region 314D, and a gate electrode 314G. The source region 314S is connected to a wiring pattern 73 via a contact electrode 83, and the drain region 314D is connected to a wiring pattern 74 via a contact electrode 84. The transistor 313 is constituted by a source region 313S, a drain region 313D, and a gate electrode 313G. The source region 313S is connected to a wiring pattern 75 via a contact electrode 85, and the drain region 313D is connected to a wiring pattern 76 via a contact electrode 86. The transistor 312 is constituted by a source region 312S, a drain region 312D, and a gate electrode 312G The source region 312S is connected to a wiring pattern 77 via a contact electrode 87, and the drain region 312D is connected to a wiring pattern 78 via a contact electrode 88. In the example shown in FIG. 5, the source regions 311S to 314S are located on the left side and the drain regions 311D to 314D are located on the right side; however, the positional relation between them can be reversed.

The wiring patterns 71 to 78 are wirings provided in a second wiring layer located below a first wiring layer in which the wiring patterns 61 and 62 are provided, and all the wiring patterns extend in the Y-direction. Tungsten may be used as the material for the wiring patterns 71 to 78, and aluminum or copper having a resistance lower than that of tungsten may be used as the material for the wiring patterns 61 and 62. Here, when it is assumed that the X-direction width of each of the wiring patterns 71 and 72 is W1, the X-direction width of each of the wiring patterns 73 and 74 is W4, the X-direction width of each of the wiring patterns 75 and 76 is W3, and the X-direction width of each of the wiring patterns 77 and 78 is W2, those widths satisfy a relation of W1>W2>W3>W4.

As shown in FIG. 5, the wiring patterns 71, 73, 75, and 77 overlap with the wiring pattern 61, and the wiring patterns 72, 74, 76, and 78 overlap with the wiring pattern 62. The wiring patterns 72, 74, 76 and 78 are connected to the wiring pattern 62 via contact electrodes 92, 94, 96, and 98, respectively. With this configuration, the power-supply potential VDDQ is supplied to all the drain regions 311D to 314D of the transistors 311 to 314. Meanwhile, in the example shown in FIG. 5, whereas the wiring pattern 71 and the wiring pattern 61 are connected to each other via contact electrodes 91, any contact electrode is not provided between each of the wiring patterns 73, 75, and 77 and the wiring pattern 61, so that the wiring patterns 73, 75, and 77 and the wiring pattern 61 are electrically isolated from each other. This means that a contact electrode that connects each of the wiring patterns 73, 75, and 77 and the wiring pattern 61 to each other is omitted due to a metal option. Accordingly, the main driver 31 shown in FIG. 5 functions as the circuit shown in FIG. 3. That is, only the transistor 311 is enabled and the other transistors 312 to 314 are disabled.

In a case where only the transistor 311 is enabled and the other transistors 312 to 314 are disabled in this manner, every time high-level read data DQ is output, the transistor 311 is turned on, and thus a large current flows through the wiring patterns 71 and 72. Therefore, when the cross-sectional area of each of the wiring patterns 71 and 72 is small, the wiring patterns 71 and 72 may be deformed by a migration phenomenon, and this may lead to disconnection. However, in the present embodiment, the wiring width W1 of the wiring patterns 71 and 72 is set to be wider than the wiring widths of the other wiring patterns 73 to 78, and therefore a sufficient cross-sectional area is ensured, so that the migration phenomenon can prevented from happening.

Figure 6A:
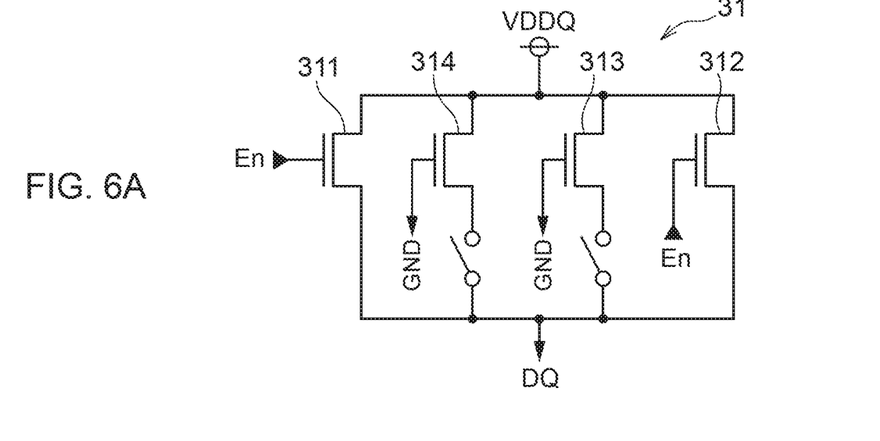
FIGS. 6A to 6C are circuit diagrams showing several configurations of a main driver that is switched by a metal option.
Figure 7A:
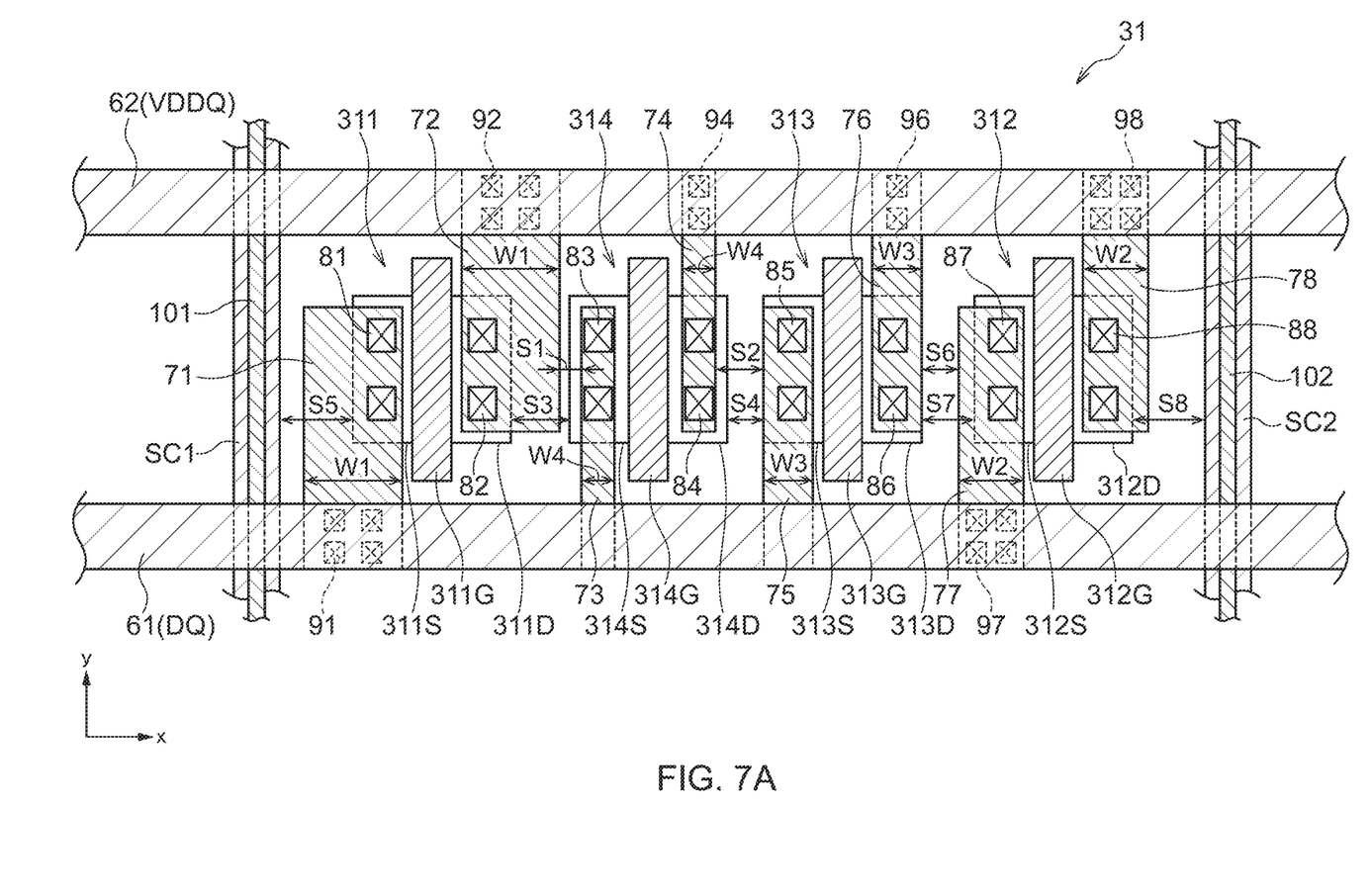
FIGS. 7A to 7C are layout diagrams showing several configurations of a main driver that is switched by a metal option.

As shown in FIG. 6A, in a case where the transistors 311 and 312 are enabled and the other transistors 313 and 314 are disabled by a metal option, the enable signal En is supplied to the gate electrodes of the transistors 311 and 312. In order to implement this supply, the wiring pattern 77 and the wiring pattern 61 are connected to each other via contact electrodes 97, as shown in FIG. 7A. In this case, when the enable signal En is activated, the two transistors 311 and 312 connected in parallel are turned on. Because the value of a current flowing through the main driver 31 is kept substantially constant by an external circuit connected to the external data I/O terminal 15, the value of a current that flows through each of the transistors 311 and 312 is ½ of a current that flows when only the transistor 311 is turned on. In this manner, because the maximum value of the current that flows through the transistor 312 is smaller than the maximum value of the current that flows through the transistor 311, the wiring width W2 of each of the wiring patterns 77 and 78 is designed to be smaller than the wiring width W1 of each of the wiring patterns 71 and 72, so that an occupied area is reduced.

Figure 6B:
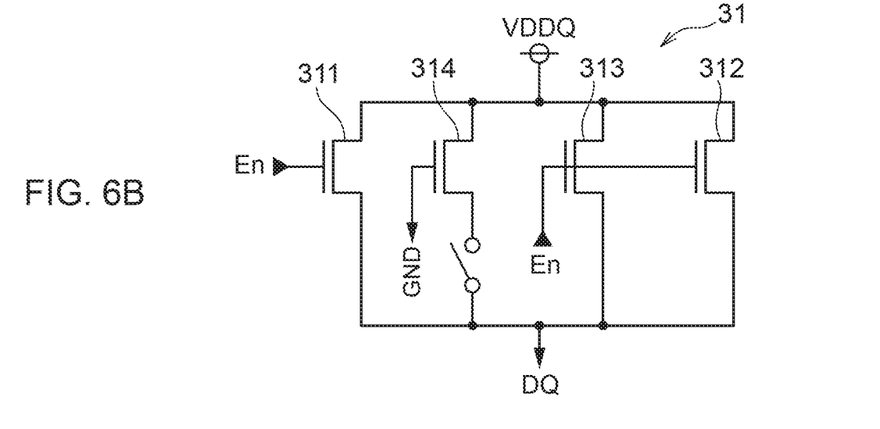
Figure 7B:
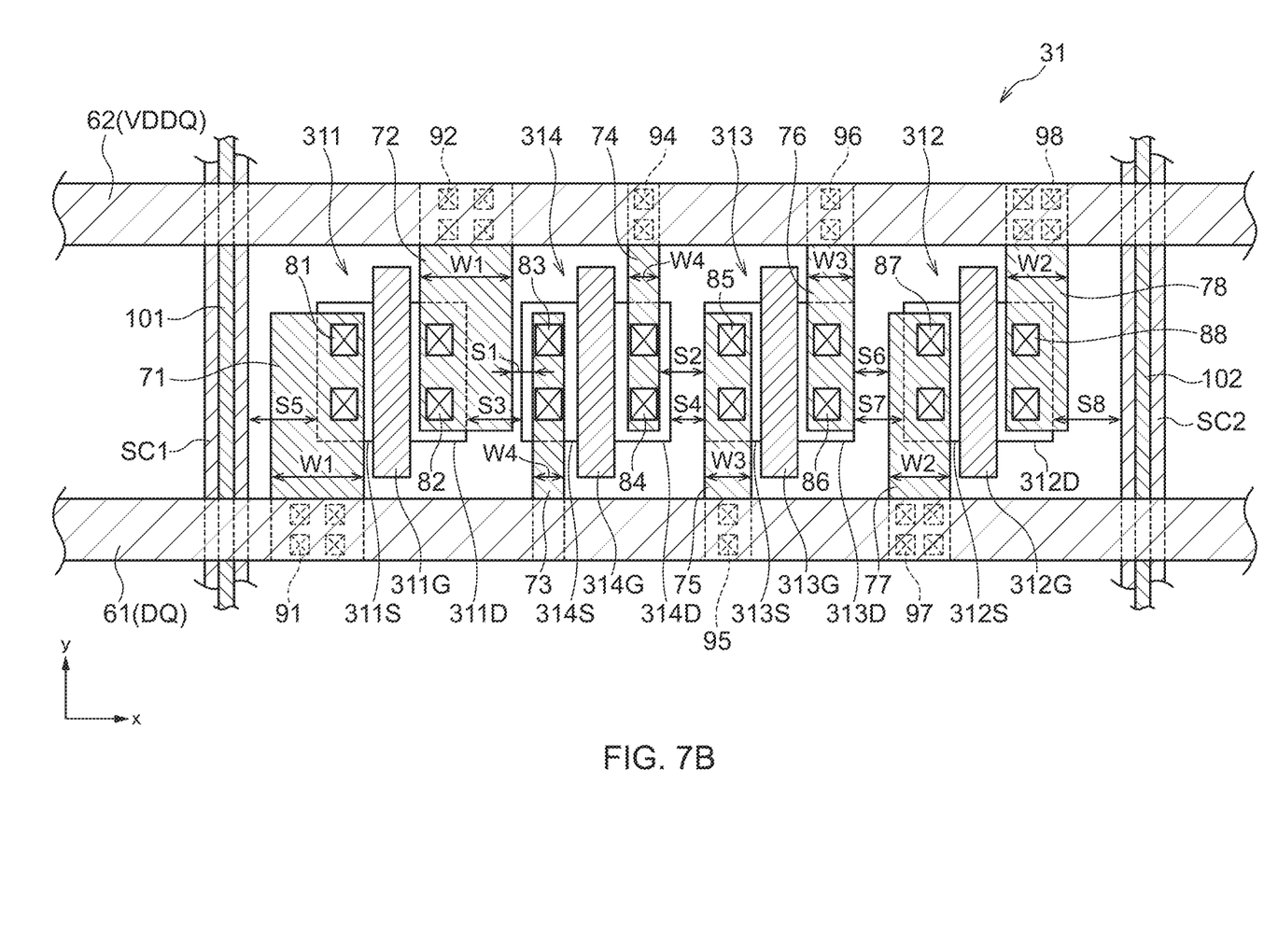

As shown in FIG. 6B, in a case where the transistors 311 to 313 are enabled and the other transistor 314 is disabled by a metal option, the enable signal En is supplied to the gate electrodes of the transistors 311 to 313. In order to implement this supply, the wiring pattern 75 and the wiring pattern 61 are connected to each other via contact electrodes 95, as shown in FIG. 7B. In this case, when the enable signal En is activated, the three transistors 311 to 313 connected in parallel are turned on. As described above, because the value of the current flowing through the main driver 31 is substantially constant, the value of a current that flows through each of the transistors 311 to 313 is ⅓ of the current that flows when only the transistor 311 is turned on. Because the maximum value of the current that flows through the transistor 313 is smaller than the maximum value of the current that flows through the transistor 312 in this manner, the wiring width W3 of each of the wiring patterns 75 and 76 is designed to be smaller than the wiring width W2 of each of the wiring patterns 77 and 78, so that an occupied area is reduced.

Figure 6C:
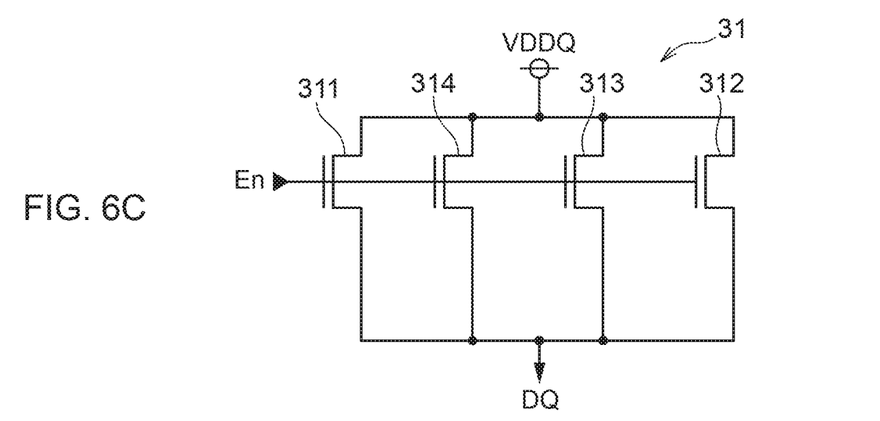
Figure 7C:
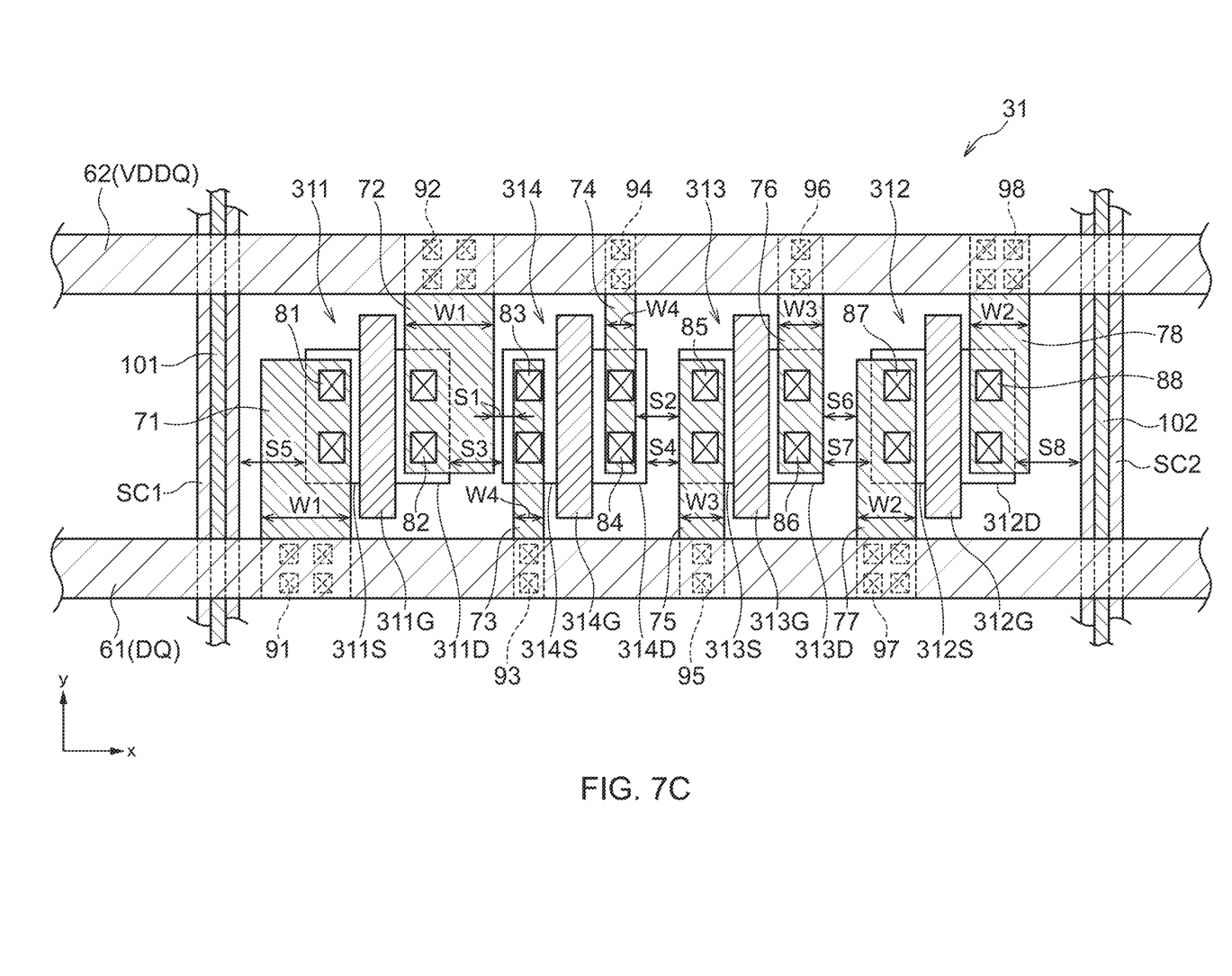

As shown in FIG. 6C, in a case where all the transistors 311 to 314 are enabled by a metal option, the enable signal En is supplied to the gate electrodes of the transistors 311 to 314. In order to implement this supply, the wiring pattern 73 and the wiring pattern 61 are connected to each other via contact electrodes 93, as shown in FIG. 7C. In this case, when the enable signal En is activated, the four transistors 311 to 314 connected in parallel are turned on. As described above, because the value of the current flowing through the main driver 31 is substantially constant, the value of a current that flows through each of the transistors 311 to 314 is ¼ of the current that flows when only the transistor 311 is turned on. Because the maximum value of the current that flows through the transistor 314 is smaller than the maximum value of the current that flows through the transistor 313 in this manner, the wiring width W4 of each of the wiring patterns 73 and 74 is designed to be smaller than the wiring width W3 of each of the wiring patterns 75 and 76, so that an occupied area is reduced.

Here, when it is assumed that a space in the X-direction between the wiring patterns 72 and 73 is S1, a space in the X-direction between the wiring patterns 74 and 75 is S2, and a space in the X-direction between the wiring patterns 76 and 77 is S6, the spaces satisfy a relation of S2>S6>S1. Further, when it is assumed that a space in the X-direction between the drain region 311D and the source region 314S is S3, a space in the X-direction between the drain region 314D and the source region 313S is S4, and a space in the X-direction between the drain region 313D and the source region 312S is S7, the spaces satisfy a relation of S3>S7>S4.

As shown in FIG. 5, the wiring pattern 72 has the wiring width W1 that is the widest width and protrudes in the X-direction beyond the drain region 311D in a plan view. Therefore, the distance between the transistors 311 and 314 is limited by the minimum space (S1) that is required between the wiring patterns 72 and 73. As a result, the space S3 between the drain region 311D and the source region 314S is wider than the minimum space (S4) that is required between the drain region 311D and the source region 314S. A relation of S3>S1 is satisfied in the example shown in FIG. 5.

Meanwhile, the wiring pattern 74 has the wiring width W4 that is the narrowest width and has no protrusion in the X-direction beyond the drain region 314D in a plan view.

This is also the same for the wiring pattern 75, and the wiring pattern 75 has no protrusion in the X-direction beyond the source region 313S in a plan view. Therefore, the distance between the transistors 314 and 313 is limited by the minimum space (S4) that is required between the drain region 314D and the source region 313S. As a result, the space S2 between the wiring patterns 74 and 75 is wider than the minimum space (S1) that is required between the wiring patterns 74 and 75. A relation of S2>S4 is satisfied in the example shown in FIG. 5.

The wiring pattern 77 has the wiring width W2 that is the second widest width and protrudes in the X-direction beyond the source region 312S in a plan view. Therefore, the distance between the transistors 313 and 312 is limited by the minimum space (S1=S6) that is required between the wiring patterns 76 and 77. As a result, the space S7 between the drain region 313D and the source region 312S is wider than the minimum space (S4) that is required between the drain region 313D and the source region 312S. A relation of S7>S6 is satisfied in the example shown in FIG. 5. However, because the amount of the X-direction protrusion of the wiring pattern 77 is smaller than the protrusion amount of the wiring pattern 72, a relation of S3>S7 is satisfied.

The source region 311S of the leftmost transistor 311 has to be apart from the diffusion region SC1 by a predetermined distance or more. Similarly, the drain region 312D of the rightmost transistor 312 has to be apart from the diffusion region SC2 by a predetermined distance or more. Here, generally, the minimum space S5 that is required between the source region 311S and the diffusion region SC1 and the minimum space S8 required between the drain region 312D and the diffusion region SC2 are wider than the minimum space (S4) that is required for a diffusion region between the transistors 311 to 314. Therefore, even in a case where wiring patterns 101 and 102 extending in the Y-direction are provided at positions overlapping with the diffusion regions SC1 and SC2, respectively a sufficient space is ensured between the wiring patterns 71 and 101 and a sufficient space is ensured between the wiring patterns 78 and 102. By using this, the transistor 311 to which the wiring patterns 71 and 72 having the widest wiring width W1 are allocated is arranged to be close to the diffusion region SC1, and the transistor 312 to which the wiring patterns 77 and 78 having the second widest wiring width W2 are allocated is arranged to be close to the diffusion region SC2, so that an occupied area is reduced.

As described above, it is possible to minimize increase of the occupied area while suppressing a migration phenomenon, by arranging the transistor 311 to which the wiring patterns 71 and 72 having the widest wiring width W1 are allocated and the transistor 312 to which the wiring patterns 77 and 78 having the second widest wiring width W2 are allocated at both ends in the X-direction, and arranging the transistor 314 to which the wiring patterns 73 and 74 having the narrowest wiring width W4 are allocated to be adjacent to the transistor 311.

While the above descriptions have focused on the unit driver 30 included in the pull-up circuit 21, also with regard to the unit driver 30 included in the pull-down circuit 22, by applying a layout identical to the unit driver 30, it is possible to minimize increase of an occupied area while suppressing a migration phenomenon.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
first and second wiring patterns in a first wiring layer extending in a first direction;
a plurality of transistors arranged in the first direction between the first and second wiring patterns, the plurality of transistors including first and second transistors arranged adjacent to each other; and
third, fourth, fifth, and sixth wiring patterns in a second wiring layer extending in a second direction crossing the first direction,
wherein the third wiring pattern is electrically connected between the first wiring pattern and one of source/drain regions of the first transistor,
wherein the fourth wiring pattern is electrically connected between the second wiring pattern and other of source/drain regions of the first transistor,
wherein the fifth wiring pattern is electrically connected to one of source/drain regions of the second transistor, the fifth wiring pattern overlapping with the first wiring pattern,
wherein the sixth wiring pattern is electrically connected to other of source/drain regions of the second transistor, the sixth wiring pattern overlapping with the second wiring pattern, and
wherein the third and fourth wiring patterns are greater in width in the first direction than the fifth and sixth wiring patterns.

2. The apparatus of claim 1, wherein the fifth wiring pattern is electrically isolated from the first wiring pattern.

3. The apparatus of claim 1, further comprising seventh and eighth wiring patterns extending in the second direction,
wherein the plurality of transistors further includes a third transistor arranged adjacent to the second transistor such that the second transistor is arranged between the first and third transistors,
wherein the seventh wiring pattern is electrically connected to one of source/drain regions of the third transistor, the seventh wiring pattern overlapping with the first wiring pattern,
wherein the eighth wiring pattern is electrically connected to other of source/drain regions of the third transistor, the eighth wiring pattern overlapping with the second wiring pattern, and
wherein the third and fourth wiring patterns are greater in width in the first direction than the seventh and eighth wiring patterns.

4. The apparatus of claim 3, wherein the seventh and eighth wiring patterns are greater in width in the first direction than the fifth and sixth wiring patterns.

5. The apparatus of claim 3, wherein the seventh wiring pattern is electrically isolated from the first wiring pattern.

6. The apparatus of claim 3,
wherein the fourth and fifth wiring patterns are arranged adjacent to each other with a first space,
wherein the sixth and seventh wiring patterns are arranged adjacent to each other with a second space, and
wherein the first space is narrower than the second space.

7. The apparatus of claim 6,
wherein the other of source/drain regions of the first transistor and the one of source/drain regions of the second transistor are arranged adjacent to each other with a third space, and
wherein the first space is narrower than the third space.

8. The apparatus of claim 7,
wherein the other of source/drain regions of the second transistor and the one of source/drain regions of the third transistor are arranged adjacent to each other with a fourth space, and
wherein the fourth space is narrower than the second space.

9. The apparatus of claim 3,
wherein the other of source/drain regions of the first transistor and the one of source/drain regions of the second transistor are arranged adjacent to each other with a third space,
wherein the other of source/drain regions of the second transistor and the one of source/drain regions of the third transistor are arranged adjacent to each other with a fourth space, and
wherein the fourth space is narrower than the third space.

10. The apparatus of claim 9, further comprising a diffusion region that applying a fixed potential to a semiconductor substrate,
wherein the diffusion region is arranged adjacent to the first transistor such that the first transistor is arranged between the diffusion region and the second transistor.

11. The apparatus of claim 10,
wherein the diffusion region and the one of source/drain regions of the first transistor are arranged adjacent to each other with a fifth space, and
wherein the fourth space is narrower than the fifth space.

12. The apparatus of claim 1, wherein the first wiring pattern is electrically connected to an external data I/O terminal.

13. The apparatus of claim 1, wherein the third, fourth, fifth, and sixth wiring patterns comprise different metal material from the first and second wiring patterns.

14. The apparatus of claim 13, wherein a first material of each of the first and second wiring patterns in the first wiring layer has a lower resistance value than a second material of each of the third, fourth, fifth and sixth wiring patterns in the second wiring layer.

15. The apparatus of claim 14, wherein the third, fourth, fifth, and sixth wiring patterns comprise tungsten.

16. An apparatus comprising:
first, second, and third transistors arranged in a first direction such that the second transistor is arranged between the first and third transistor;
a power supply pattern extending in the first direction;
first, second, third, fourth, fifth, and sixth wiring patterns extending in a second direction crossing the first direction,
wherein the first, third, and fifth wiring patterns are electrically connected to one of source/drain regions of the first, second, and third transistors, respectively,
wherein the second, fourth, and sixth wiring patterns are electrically connected between the power supply pattern and other of source/drain regions of the first, second, and third transistors, respectively, wherein the second and third wiring patterns are arranged adjacent to each other with a first space, wherein the fourth and fifth wiring patterns are arranged adjacent to each other with a second space, wherein the other of source/drain regions of the first transistor and the one of source/drain regions of the second transistor are arranged adjacent to each other with a third space, wherein the other of source/drain regions of the second transistor and the one of source/drain regions of the third transistor are arranged adjacent to each other with a fourth space, wherein the first space is narrower than the second space, and wherein the fourth space is narrower than the third space.

17. The apparatus of claim 16, wherein the first space is narrower than the third space.

18. The apparatus of claim 16, wherein the fourth space is narrower than the second space.

19. The apparatus of claim 16, wherein the first and second wiring patterns are greater in width in the first direction than the third, fourth, fifth and sixth wiring patterns.

20. An apparatus comprising:
first, second, and third transistors arranged in a first direction such that the second transistor is arranged between the first and third transistor;
a power supply pattern extending in the first direction;
first, second, third, fourth, fifth, and sixth wiring patterns extending in a second direction crossing the first direction, wherein the first, third, and fifth wiring patterns are electrically connected to one of source/drain regions of the first, second, and third transistors, respectively, wherein the second, fourth, and sixth wiring patterns are electrically connected between the power supply pattern and other of source/drain regions of the first, second, and third transistors, respectively, wherein the second and third wiring patterns are arranged adjacent to each other with a first space, wherein the fourth and fifth wiring patterns are arranged adjacent to each other with a second space, wherein the other of source/drain regions of the first transistor and the one of source/drain regions of the second transistor are arranged adjacent to each other with a third space, wherein the other of source/drain regions of the second transistor and the one of source/drain regions of the third transistor are arranged adjacent to each other with a fourth space, wherein the first space is narrower than the third space, and wherein the fourth space is narrower than the second space.

21. The apparatus of claim 20, wherein the first and second wiring patterns are greater in width in the first direction than the third, fourth, fifth and sixth wiring patterns.

* * * * *